(12) United States Patent  
Gheitanchi et al.

(10) Patent No.: US 8,687,733 B1  
(45) Date of Patent: Apr. 1, 2014

(54) DIGITAL PREDISTORTION (DPD) METHOD AND SYSTEM FOR SELECTING AT LEAST ONE DATA SAMPLE

(75) Inventors: Shahin Gheitanchi, Maidenhead (GB); Lei Xu, High Wycombe (GB)

(73) Assignee: Altera Corporation, San Jose, CA (US)

( * ) Notice: Subject to any disclaimer, the term of this patent is extended or adjusted under 35 U.S.C. 154(b) by 29 days.

(21) Appl. No.: 13/450,335

(22) Filed: Apr. 18, 2012

(51) Int. Cl.  
*H04K 1/02* (2006.01)

(52) U.S. Cl.  
USPC .......................... 375/297; 375/302; 455/114.3

(58) Field of Classification Search  
None  
See application file for complete search history.

(56) References Cited

U.S. PATENT DOCUMENTS

| 7,479,828 | B2 | 1/2009 | Benedict |
| 2009/0111399 | A1* | 4/2009 | Norris et al. ............... 455/114.3 |
| 2009/0310710 | A1* | 12/2009 | Farrokhi ...................... 375/302 |

* cited by examiner

*Primary Examiner* — Leon-Viet Nguyen

(57) ABSTRACT

A method, circuit, and a system for performing digital predistortion are disclosed. Digital predistortion may be used to compensate for or null the distortion caused by power amplifiers. The distortion of power amplifiers is usually larger at higher magnitudes or powers, and therefore, a larger percentage of the samples collected for the digital predistortion may be of higher magnitude or power. At least one sample of lower magnitude or power may be ignored or not collected. Accordingly, fewer samples can be used to perform digital predistortion, thereby allowing digital predistortion to be performed more quickly and efficiently with fewer resources.

19 Claims, 15 Drawing Sheets

200B

700

| Counter Information | Magnitude |
|---|---|
| 1 | 1-10 |
| 2 | 11-20 |
| 3 | 21-30 |
| 4 | 31-40 |
| 5 | 41-50 |
| 6 | 51-60 |
| 7 | 61-70 |
| 8 | 71-80 |
| 9 | 81-90 |
| 10 | 91-100 |

(710 = Counter Information column, 720 = Magnitude column)

FIGURE 7

DIGITAL PREDISTORTION (DPD) METHOD AND SYSTEM FOR SELECTING AT LEAST ONE DATA SAMPLE

BACKGROUND OF THE INVENTION

Power amplifiers are typically used to amplify signals for wireless transmission. For example, remote radio heads (RRHs) use power amplifiers to amplify analog signals which are transmitted to implement WiMAX and other wireless networks.

Signal distortion caused by the power amplifiers is often compensated for using predistortion. Predistortion involves distorting initial signals before supplying them to the amplifier such that the distortion of the power amplifier will null the predistortion, where the predistortion may be approximately an inverse of the distortion of the power amplifier. In this manner, amplified signals can be generated with signal characteristics similar to the initial signal. The predistortion is typically performed in the digital domain before digital-to-analog conversion is used to generate the analog signals supplied to the power amplifier for amplification.

Conventional solutions utilize samples of the initial signals and amplified signals for performing digital predistortion. The samples are collected in blocks of consecutive samples without considering the magnitude of the samples. The blocks of samples are then used to determine the distortion applied to the initial signals.

Although conventional solutions are capable of reducing the effect of the power amplifier distortion by applying predistortion to the initial signals, the amount of samples utilized by conventional solutions is relatively large. Processing of the samples to determine the predistortion is computationally complex, resource-hungry and time consuming. Accordingly, conventional solutions which utilize a relatively large number of samples to perform digital predistortion demand a relatively large amount of resources. Furthermore, the time required for performing such digital predistortion is relatively large, thereby causing conventional solutions which utilize a relatively large number of samples to be slow and inefficient.

SUMMARY OF THE INVENTION

Accordingly, a need exists to perform digital predistortion using fewer resources. A need also exists to perform digital predistortion in a faster and/or more efficient manner. Embodiments of the present invention provide novel solutions to these needs and others as described below.

Embodiments of the present invention are directed to a method, circuit, and a system for performing digital predistortion. Digital predistortion may be used to compensate for or null the distortion caused by power amplifiers. The distortion of power amplifiers is usually larger at higher magnitudes or powers, and therefore, a larger percentage of the samples collected for the digital predistortion may be of higher magnitude or power. At least one sample of lower magnitude or power may be ignored or not collected. Accordingly, fewer samples (e.g., including more samples of higher magnitudes and fewer samples of lower magnitudes) can be used to perform digital predistortion, thereby allowing digital predistortion to be performed more quickly and efficiently with fewer resources.

In one embodiment, a method of selecting at least one data sample includes accessing a first data sample of a plurality of data samples. The method also includes determining, based on a magnitude associated with the first data sample, a value associated with a counter of a plurality of counters associated with the first data sample. The value associated with the counter is scaled to determine a limit associated with said counter. It is determined whether the counter has reached the limit. The method also includes generating at least one signal, if the counter has not reached the limit, for selecting the first data sample for use in performing digital predistortion of data before generation of an analog signal for input to an amplifier.

In another embodiment, a circuit includes a first component operable to access a first data sample of a plurality of data samples, wherein the first component is further operable to determine, based on a magnitude associated with the first data sample, a value associated with a counter of a plurality of counters associated with the first data sample. A second component is operable to scale the value associated with the counter to determine a limit associated with the counter. The circuit also includes a third component operable to determine whether the counter has reached a limit, and wherein the third component is further operable to generate at least one signal, if the counter has not reached the limit, for selecting the first data sample for use in performing digital predistortion of data before generation of an analog signal for input to an amplifier.

In yet another embodiment, a system includes a processor, a memory operable to implement a plurality of counters and a circuit. The circuit includes a first component operable to access a first data sample of a plurality of data samples, wherein the first component is further operable to determine, based on a magnitude associated with the first data sample, a value associated with a counter of the plurality of counters associated with the first data sample. A second component is operable to scale the value associated with the counter to determine a limit associated with the counter. The circuit also includes a third component operable to determine whether the counter has reached a limit, and wherein the third component is further operable to generate at least one signal, if the counter has not reached the limit, for selecting the first data sample for use in performing digital predistortion of data before generation of an analog signal for input to an amplifier.

BRIEF DESCRIPTION OF THE DRAWINGS

The present invention is illustrated by way of example, and not by way of limitation, in the figures of the accompanying drawings and in which like reference numerals refer to similar elements.

FIG. 7 shows an exemplary data structure including an index of counter information and magnitudes in accordance with one embodiment of the present invention.

DETAILED DESCRIPTION OF THE INVENTION

Figure 1:
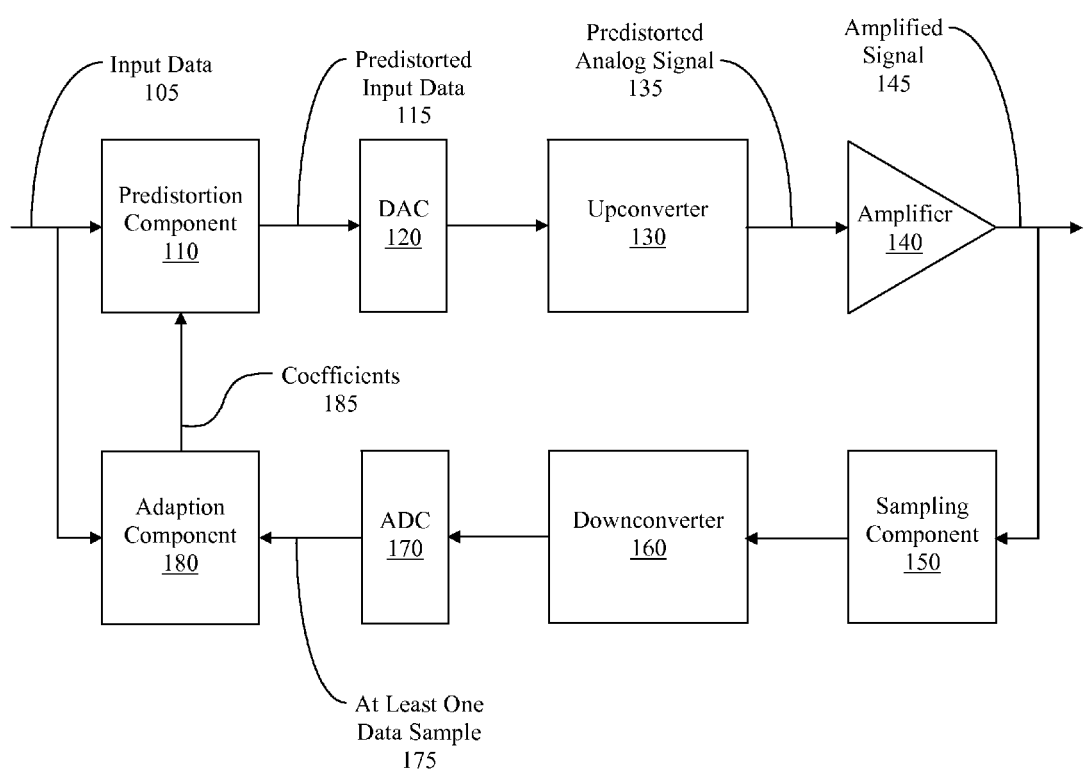
FIG. 1 shows an exemplary system for performing digital predistortion in accordance with one embodiment of the present invention.

Reference will now be made in detail to embodiments of the present invention, examples of which are illustrated in the accompanying drawings. While the present invention will be discussed in conjunction with the following embodiments, it will be understood that they are not intended to limit the present invention to these embodiments alone. On the contrary, the present invention is intended to cover alternatives, modifications, and equivalents which may be included with the spirit and scope of the present invention as defined by the appended claims. Furthermore, in the following detailed description of the present invention, numerous specific details are set forth in order to provide a thorough understanding of the present invention. However, embodiments of the present invention may be practiced without these specific details. In other instances, well-known methods, procedures, components, and circuits have not been described in detail so as not to unnecessarily obscure aspects of the present invention.

Notation and Nomenclature

Some portions of the detailed descriptions which follow are presented in terms of procedures, logic blocks, processing and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing the terms such as "accepting," "accessing," "adding," "analyzing," "applying," "assembling," "assigning," "bypassing," "calculating," "capturing," "changing," "collecting," "combining," "communicating," "comparing," "conducting," "configuring," "creating," "defining," "depicting," "detecting," "determining," "displaying," "establishing," "executing," "facilitating," "filtering," "generating," "grouping," "identifying," "incrementing," "initiating," "interacting," "modifying," "monitoring," "moving," "notifying," "outputting," "performing," "placing," "presenting," "processing," "programming," "providing," "querying," "reading," "removing," "repeating," "sampling," "scaling," "setting," "sorting," "storing," "subtracting," "tracking," "transforming," "using," "writing," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the Present Invention

FIG. 1 shows exemplary system 100 for performing digital predistortion in accordance with one embodiment of the present invention. As shown in FIG. 1, predistortion component may access and distort input data 105 (e.g., to generate predistorted input data 115) before being supplied to amplifier 140 (e.g., as predistorted analog signal 135) such that the distortion of the amplifier (e.g., 140) will approximately null the predistortion (e.g., applied by predistortion component 110). The term "predistortion" may be used herein to mean distortion of data or a signal before access by another component (e.g., amplifier 140). In this manner, digital predistortion of data may be performed (e.g., by predistortion component 110) to compensate for distortion of an amplifier (e.g., 140).

Figure 2A:
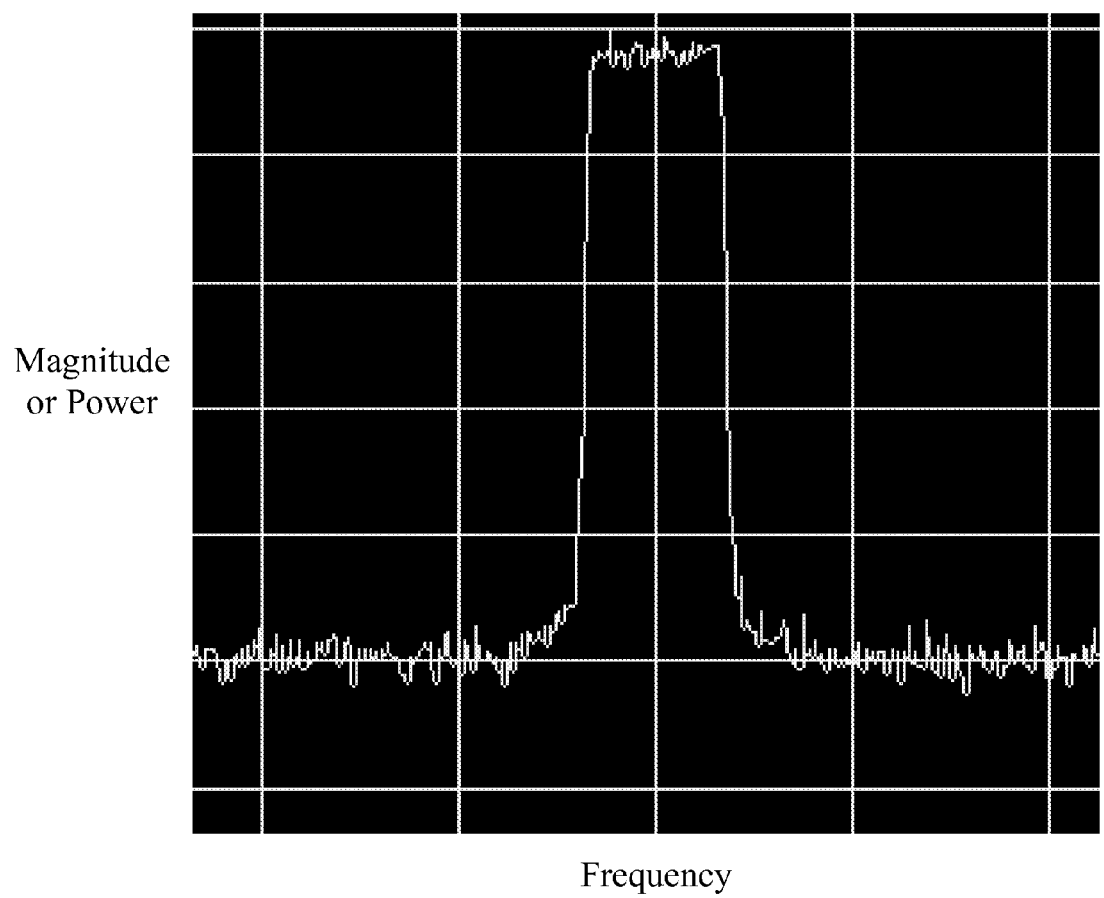
FIG. 2A shows a first exemplary diagram illustrating use of predistortion to compensate for distortion of an amplifier in accordance with one embodiment of the present invention.
Figure 2B:
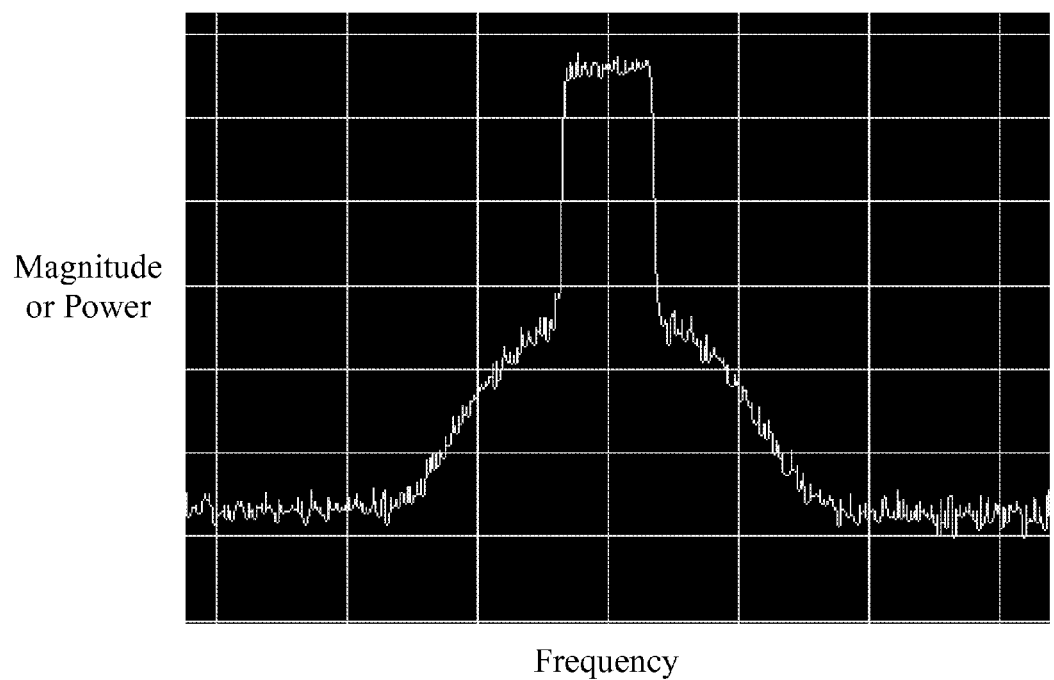
FIG. 2B shows a second exemplary diagram illustrating use of predistortion to compensate for distortion of an amplifier in accordance with one embodiment of the present invention.
Figure 2C:
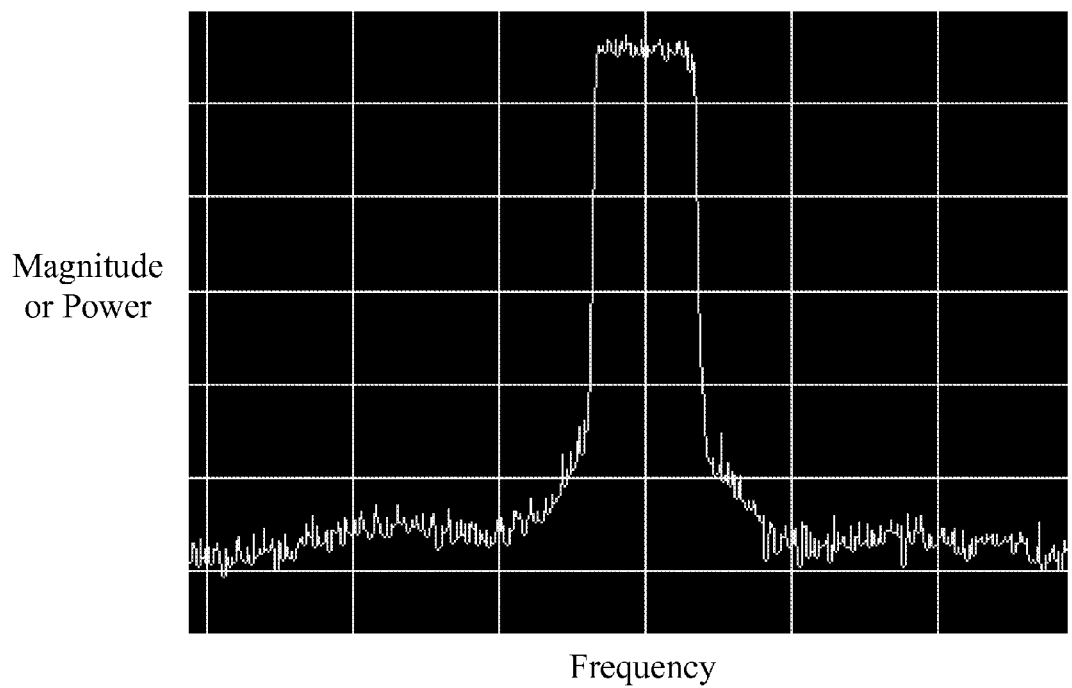
FIG. 2C shows a third exemplary diagram illustrating use of predistortion to compensate for distortion of an amplifier in accordance with one embodiment of the present invention.

FIGS. 2A, 2B and 2C show exemplary diagrams illustrating use of predistortion to compensate for distortion of an amplifier in accordance with one embodiment of the present invention. Each of the diagrams (e.g., 200A, 200B and 200C) may represent a respective magnitude or power (e.g., along the "y" axis) at different frequencies (e.g., along the "x" axis). Diagram 200A may represent data (e.g., input data 105) and/or a signal before predistortion, whereas diagram 200B may represent data (e.g., predistorted input data 115) and/or a signal (e.g., predistorted analog signal 135, a signal generated by digital-to-analog converter 120, etc.) after predistortion. In one embodiment, the difference in shape between the signals depicted in diagrams 200A and 200B may be caused at least in part by the predistortion (e.g., performed by predistortion component 110).

As shown in FIG. 2C, diagram 200C may represent data or a signal (e.g., amplified signal 145) output by the amplifier (e.g., 140). The difference in shape between the signals depicted in diagrams 200B and 200C may be caused at least in part by the distortion of the amplifier (e.g., 140). In one embodiment, the shape of the signal depicted in FIG. 2C may be more like or approximately the same as the signal depicted in FIG. 2A. And in one embodiment, the signal depicted in FIG. 2C may have similar signal characteristics as the signal depicted in FIG. 2A. Accordingly, the predistortion (e.g., performed by predistortion component 110) may compensate for (e.g., by reducing, nulling, correcting, etc.) distortion of an amplifier (e.g., 140).

Figure 3A:
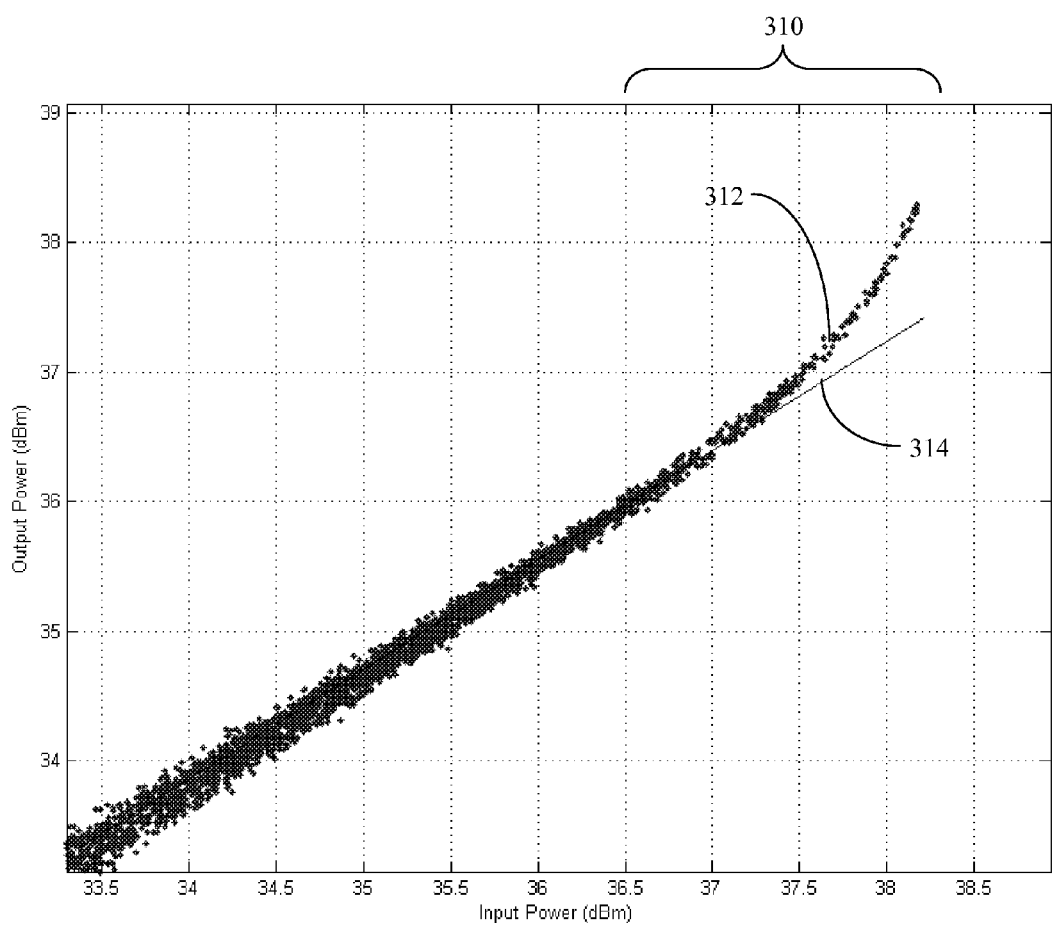
FIG. 3A shows a diagram of an exemplary response of a predistortion component in accordance with one embodiment of the present invention.
Figure 3B:
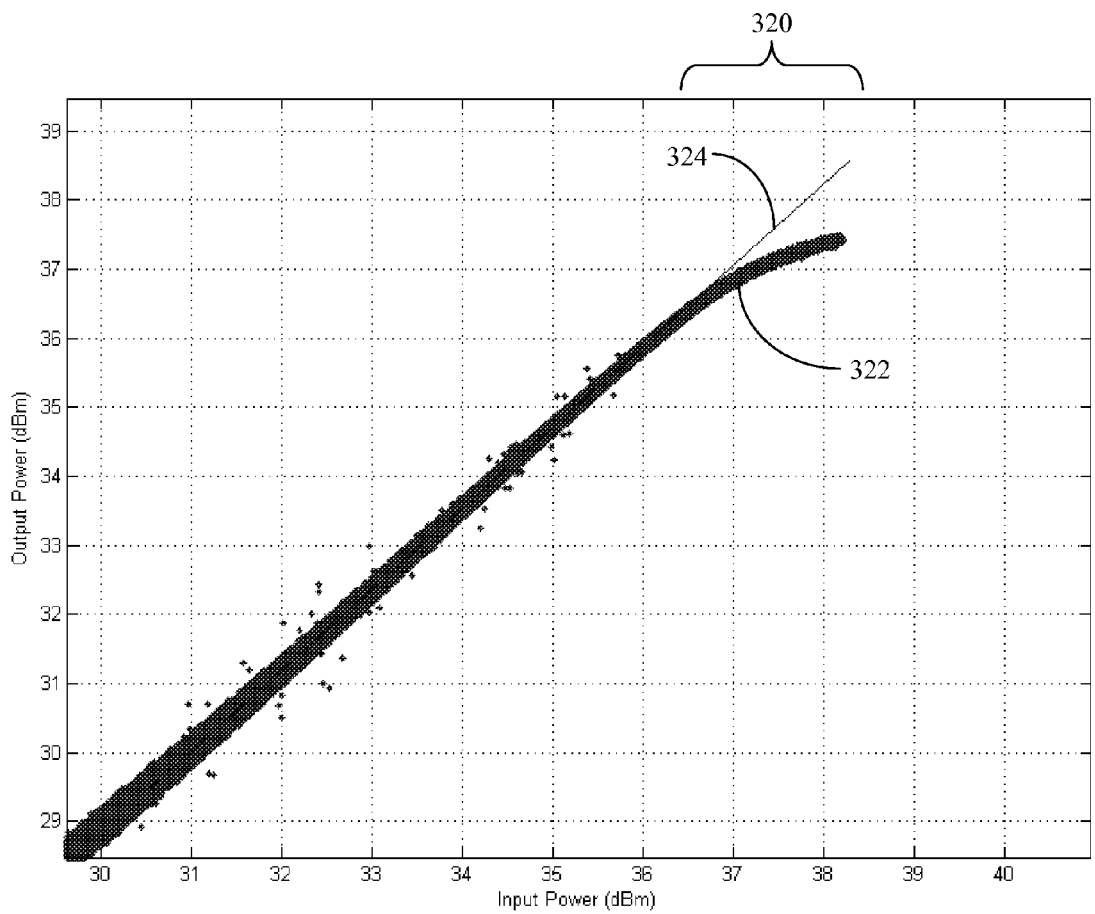
FIG. 3B shows a diagram of an exemplary response of an amplifier in accordance with one embodiment of the present invention.

In one embodiment, the predistortion (and/or the response of predistortion component 110) may be a function of or otherwise related to the response of the amplifier (e.g., 140). For example, FIG. 3A shows diagram 300A of exemplary response 312 of a predistortion component (e.g., 110) in accordance with one embodiment of the present invention, whereas FIG. 3B shows diagram 300B of exemplary response 322 of an amplifier (e.g., 140) in accordance with one embodiment of the present invention. The distortion of the amplifier (e.g., 140) may be represented in FIG. 3B by the deviation of response 322 from line 324 within the magnitude range 320 (e.g., associated with higher magnitudes or powers). The predistortion applied by the predistortion component (e.g., 110) may be represented in FIG. 3A by the deviation of response 312 from line 314 within the magnitude range 310 (e.g., associated with higher magnitudes or powers). In one embodiment, the portion of response 312 of the predistortion component (e.g., 110) as shown in magnitude range 310 (e.g., of FIG. 3A) may be approximately the inverse of the portion of response 322 of the amplifier (e.g., 140) as shown in magnitude range 320 (e.g., of FIG. 3B). In this manner, the predistortion applied by the predistortion component (e.g., represented by the upward curve of response 312 depicted in FIG. 3A) may compensate for the distortion of the amplifier (e.g., represented by the downward curve of response 322 depicted in FIG. 3B).

Turning back to FIG. 1, predistortion may be performed (e.g., by predistortion component 110) based on coefficients (e.g., 185) supplied from an adaption component (e.g., 180), where the coefficients (e.g., 185) may be generated based on a plurality of samples (e.g., data samples) of a signal (e.g., amplified signal 145) output by an amplifier (e.g., 140). The plurality of samples (e.g., as discussed with respect to FIGS. 5, 6A, 6B, 6C, 7, etc.) may be selected by an adaption component (e.g., 180) from a larger set of samples (e.g., generated by sampling component 150 based on amplified signal 145, as supplied to adaptation component 180 as at least one data sample 175, etc.) based on at least one respective power or magnitude of each of the samples. For example, a larger number of samples of higher magnitudes may selected than samples of lower magnitudes since distortion of amplifiers is typically larger at higher magnitudes or powers (e.g., as illustrated by response 322 in magnitude range 320 of FIG. 3B). At least some of the samples of lower magnitude or power (e.g., at magnitudes below magnitude range 310, at magnitudes below magnitude range 320, etc.) may not be selected for collection (e.g., by adaptation component 110). In this manner, fewer samples (e.g., including more samples of higher magnitudes and fewer samples of lower magnitudes) can be used to perform digital predistortion, thereby allowing digital predistortion to be performed more quickly and efficiently with fewer resources (e.g., compared to conventional solutions that use blocks of consecutive samples without considering the magnitude of the samples).

In one embodiment, predistortion (e.g., performed by predistortion component 110) and/or adaption (e.g., performed by adaption component 180) may be performed in the digital domain, whereas amplification (e.g., performed by amplifier 140) may be performed in the analog domain. Accordingly, digital signals or data (e.g., predistorted input data 115) from predistortion component 110 may be converted to analog signals using digital-to-analog converter (DAC) 120. Samples generated (e.g., by sampling component 150) from the output of amplifier 140 (e.g., amplified signal 145) may be converted from analog signals to digital signals (e.g., at least one data sample 175) by analog-to-digital converter (ADC) 170.

As shown in FIG. 1, upconversion of analog signals from DAC 120 may be performed using upconverter 130 in one embodiment. And in one embodiment, downconversion of analog signals from sampling component 150 may be performed using downconverter 160.

Amplifier 140 may be a power amplifier in one embodiment. For example, amplifier 140 may be used to amplify signals for wireless transmission. In one embodiment, amplifier 140 may be included in or otherwise used by at least one remote radio head (RRH) to amplify analog signals which are transmitted to implement WiMAX and/or other wireless networks. And in one embodiment, amplifier 140 and at least one other component of system 100 (e.g., used to perform digital predistortion, adaption, etc.) may be included in or otherwise used by the same RRH or RRHs.

Although FIG. 1 shows system 100 as including a specific number and arrangement of components, it should be appreciated that system 100 may include a different number and/or arrangement of components in other embodiments. Additionally, although FIGS. 2A, 2B and 2C depict diagrams with specific signals, it should be appreciated that the diagrams (e.g., 200A, 200B, 200C, etc.) may include different signals in other embodiments. Further, although FIGS. 3A and 3B depict diagrams with specific responses, it should be appreciated that the diagrams (e.g., 300A, 300B, etc.) may include different responses in other embodiments.

Figure 4:
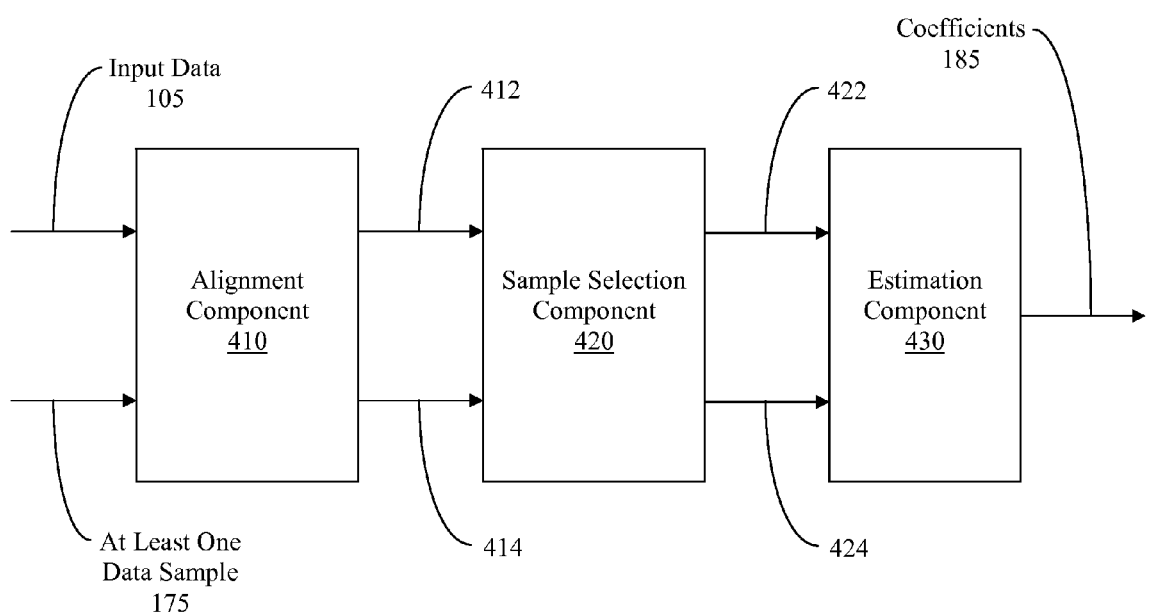
FIG. 4 shows an exemplary adaptation component in accordance with one embodiment of the present invention.

FIG. 4 shows exemplary adaptation component 180 in accordance with one embodiment of the present invention. As shown in FIG. 4, alignment component 410 may align input data 105 and at least one data sample 175 (e.g., associated with or generated based on amplified signal 145). In one embodiment, at least one data sample 175 may be delayed with respect to input data 105 since it is processed and/or accessed by one or more components (e.g., sampling component 150, downconverter 160, ADC 170, etc.), and therefore, alignment component 410 may delay input data 105 to align input data 105 to at least one data sample 175. Accordingly, signals 412 and 414 may be generated and/or output from alignment component as aligned versions of input data 105 and at least one data sample 175, respectively. Alternatively, alignment component 420 may pass through input data 105 and at least one data sample 175 without adding any delay.

Sample selection component 420 may select one or more data samples. Data samples may be selected (e.g., in accordance with process 600 of FIGS. 6A, 6B and 6C) from the one or more data samples (e.g., accessed by sample selection component 420 as signal 412, signal 414, input data 105, at least one data sample 175, some combination thereof, etc.) based on one or more attributes of the data samples (e.g., magnitude, etc.). The selected data samples may be output as signal 422 (e.g., associated with signal 412 and/or input data 105) and/or signal 424 (e.g., associated with signal 414 and/or at least one data sample 175) in one embodiment.

As shown in FIG. 4, estimation component may access selected samples (e.g., communicated via signal 422 and/or signal 424) and perform estimation based thereon to generate coefficients (e.g., 185). The estimation may include least squares estimation in one embodiment.

Although FIG. 4 shows adaptation component 180 as including a specific number of components, it should be appreciated that adaptation component 180 may include a different number of components in other embodiments. Additionally, although FIG. 4 shows adaptation component 180 as including a specific arrangement of components, it should be appreciated that adaptation component 180 may include a different arrangement of components in other embodiments.

Figure 5:
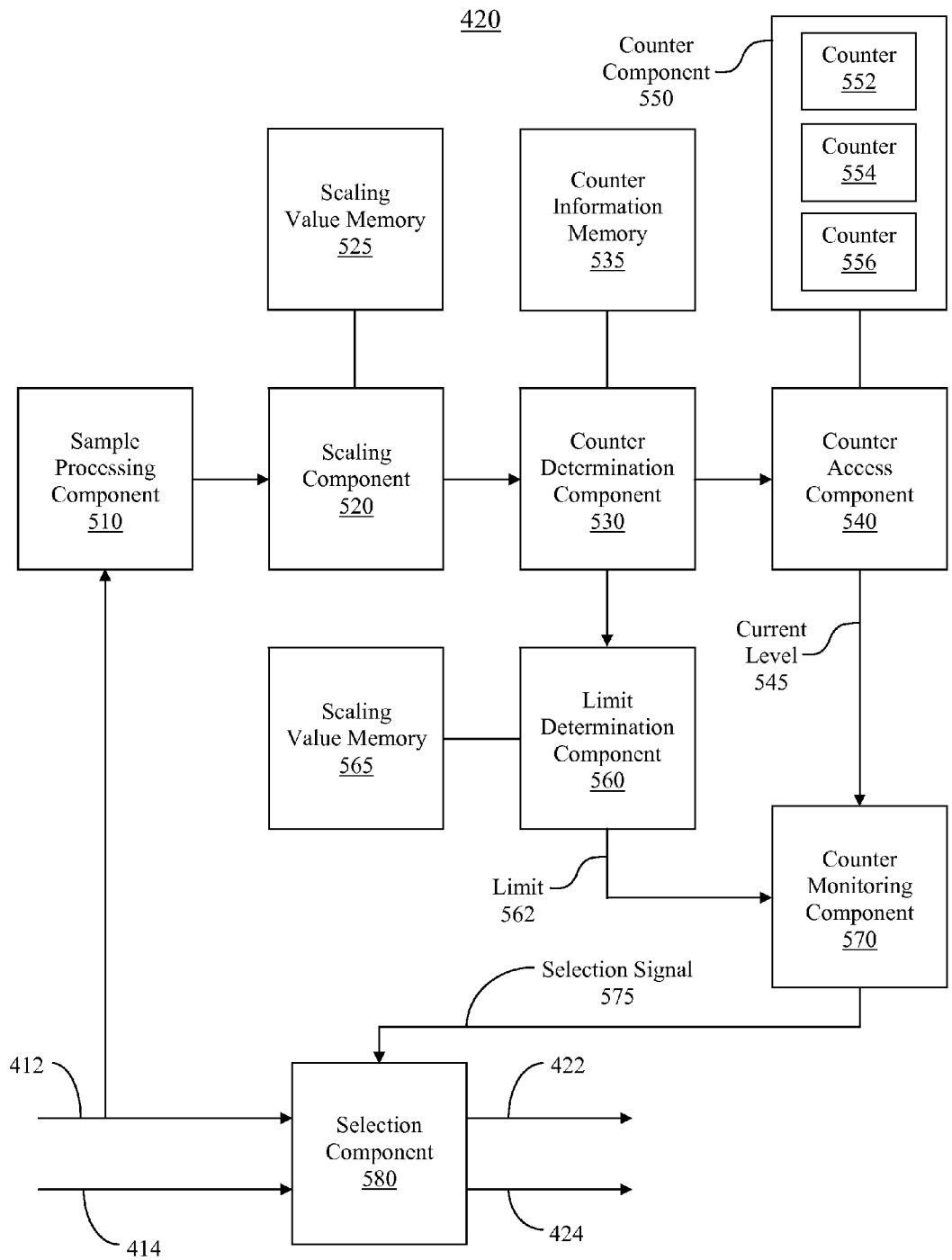
FIG. 5 shows an exemplary sample selection component in accordance with one embodiment of the present invention.
Figure 6A:
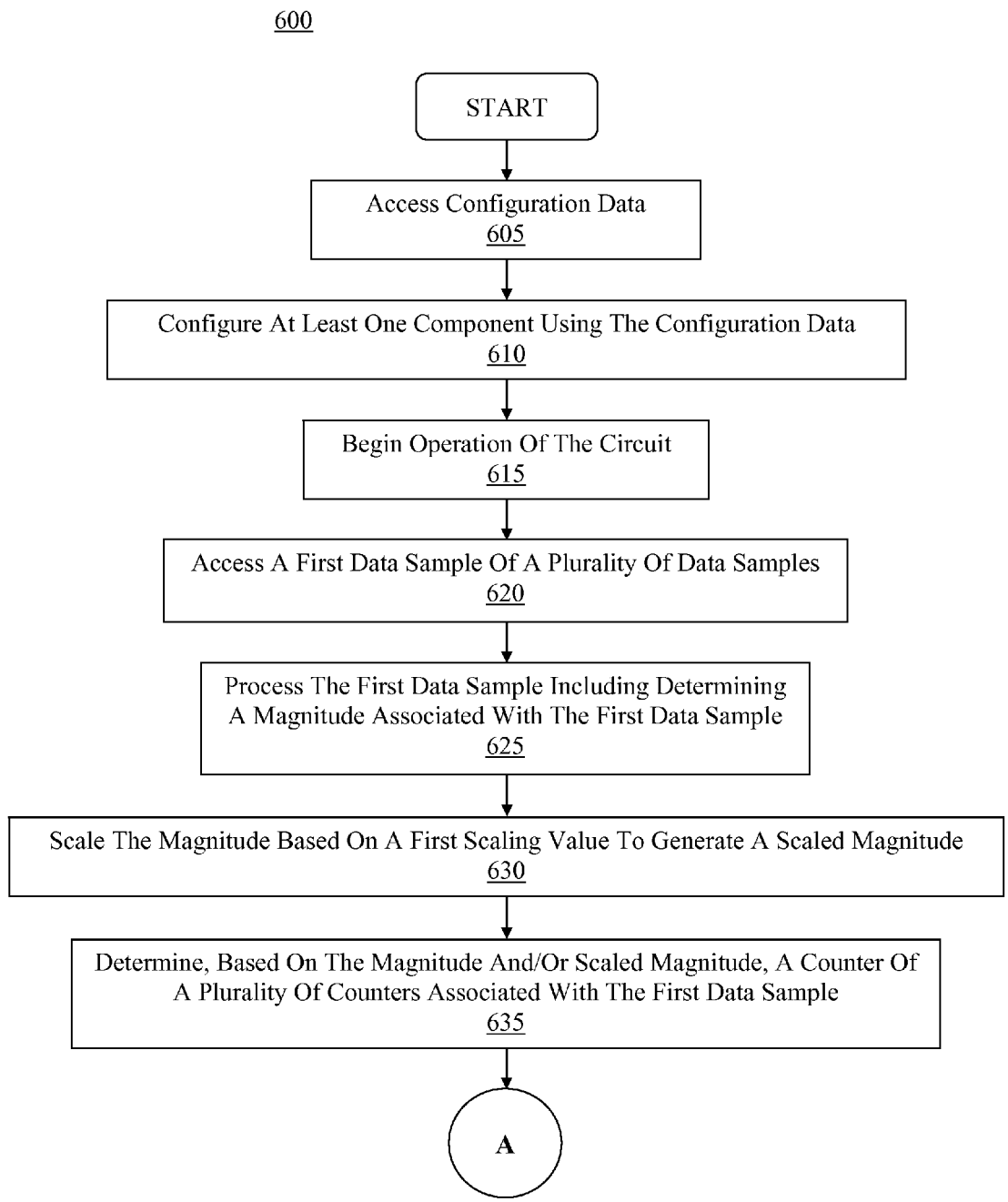
FIG. 6A shows a first portion of a flowchart of an exemplary process for selecting at least one data sample in accordance with one embodiment of the present invention.
Figure 6B:
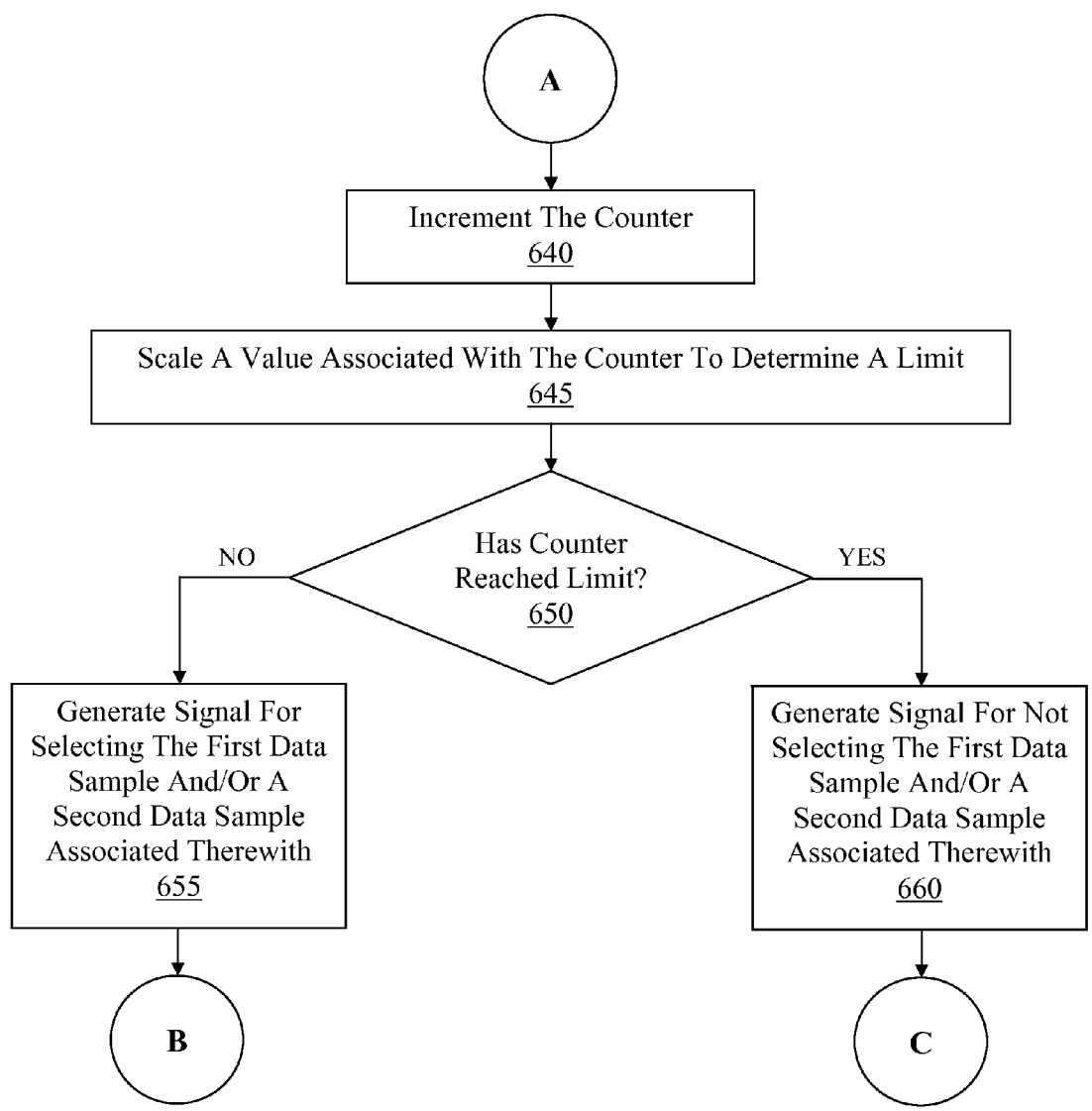
FIG. 6B shows a second portion of a flowchart of an exemplary process for selecting at least one data sample in accordance with one embodiment of the present invention.
Figure 6C:
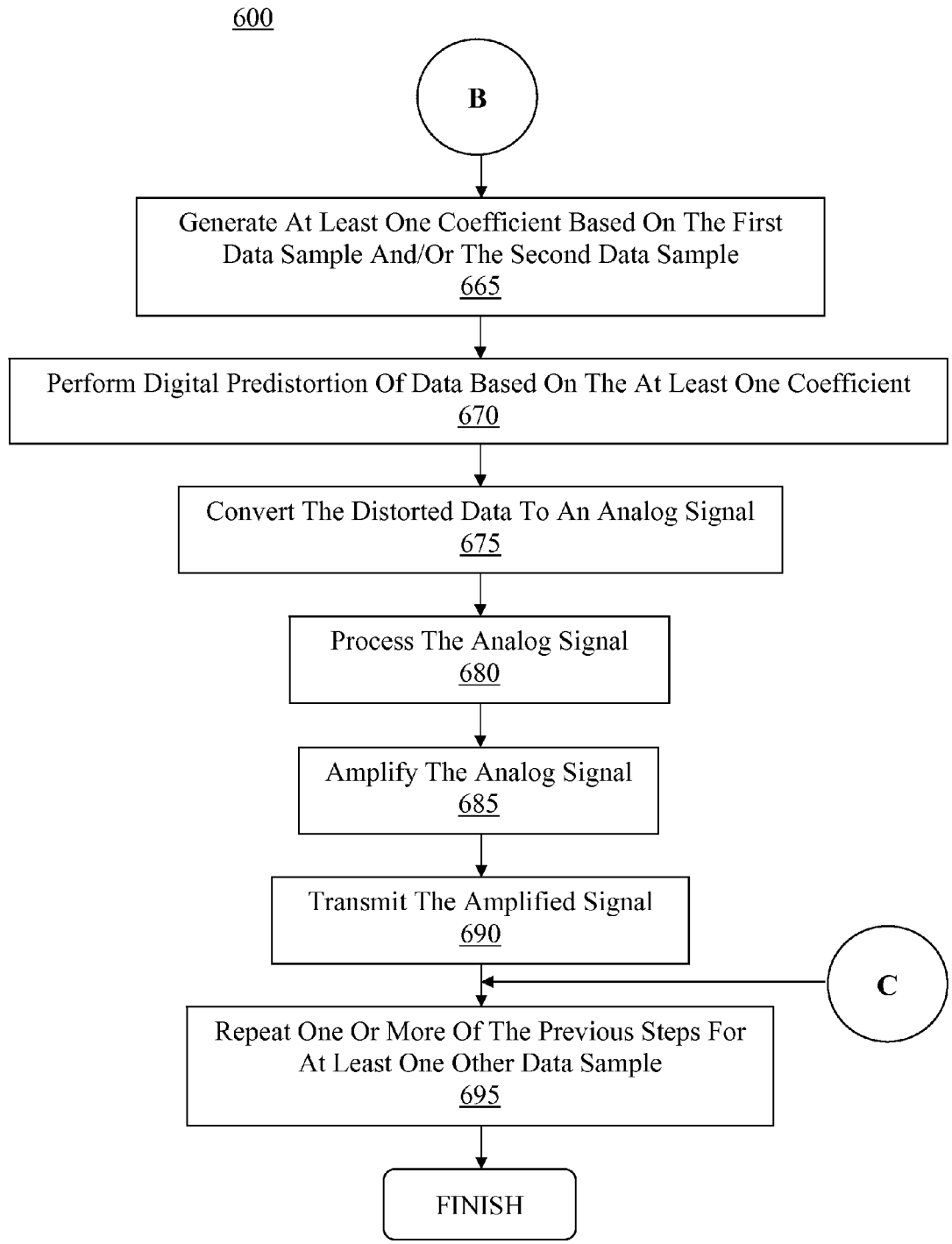
FIG. 6C shows a third portion of a flowchart of an exemplary process for selecting at least one data sample in accordance with one embodiment of the present invention.

FIG. 5 shows exemplary sample selection component 420 in accordance with one embodiment of the present invention. FIG. 5 will be described in conjunction with FIGS. 6A, 6B and 6C. FIGS. 6A, 6B and 6C show a flowchart of exemplary process 600 for selecting at least one data sample in accordance with one embodiment of the present invention.

As shown in FIG. 6A, step 605 involves accessing configuration data. Step 610 involves configuring at least one component (e.g., scaling component 120 of FIG. 5, counter determination component 530 of FIG. 5, limit determination component 560 of FIG. 5, some combination thereof, etc.) using the configuration data. Step 605 and/or step 610 may be performed before operation or runtime of a circuit or other component (e.g., of system 100, adaptation component 180 of FIG. 4, sample selection component 420 of FIG. 5, etc.). Additionally, step 605 and/or step 610 may be performed by a user, automatically by a system or component, some combination thereof, etc.

In one embodiment, the at least one component may be configured in step 610 by storing the configuration data (e.g., accessed in step 605) in one or more memories. For example, configuration data associated with scaling component 520 (e.g., at least one scaling value) may be stored in scaling value memory 525. As another example, configuration data associated with counter determination component 530 (e.g., a respective magnitude or respective range of magnitudes associated with each counter or bin of counter component 550, etc.) may be stored in counter information memory 535. As yet another example, configuration data associated with limit determination component 560 (e.g., at least one scaling value) may be stored in scaling value memory 565.

As shown in FIG. 6A, step 615 involves beginning operation of the circuit (e.g., of system 100, adaptation component 180 of FIG. 4, sample selection component 420 of FIG. 5, etc.). For example, step 615 may involve applying a power or clock signal to one or more components of the circuit. As another example, step 615 may involve gating or otherwise supplying at least one signal (e.g., input data 105, at least one data sample 175, etc.) to one or more components of the circuit. And in one embodiment, step 615 may involve resetting or initializing one or more counters (e.g., 552, 554, 556, etc.) of counter component 550 of FIG. 5.

Step 620 involves accessing a first data sample of a plurality of data samples. In one embodiment, step 620 may involve accessing (e.g., at sample processing component 510) a first data sample via signal 412 as shown in FIG. 6A. The first data sample may be associated with or generated based on input data (e.g., 105) in one embodiment.

As shown in FIG. 6A, step 625 involves processing the first data sample including determining a magnitude associated with the first data sample. In one embodiment, step 625 may involve determining the magnitude of the first data sample based on a vector of a complex number associated with the first data sample (e.g., by determining the length of the vector). And in one embodiment, step 625 may involve converting the magnitude to an integer.

Step 630 involves scaling the magnitude based on a first scaling value to generate a scaled magnitude. The magnitude may be increased or decreased based on the first scaling value in step 630. The scaling in step 630 may be performed by scaling component 520 (e.g., of FIG. 5) based on a first scaling value accessed from scaling value memory 525 (e.g., of FIG. 5) in one embodiment. The scaling performed in step 630 may involve performing a multiplication operation using the magnitude and the first scaling value and/or a division operation using the magnitude and the first scaling value (e.g., by inverting the magnitude and multiplying the result by the first scaling value, by inverting the first scaling value and multiplying the result by the magnitude, etc.). The first scaling value may be stored in scaling value memory 525 in step 610 in one embodiment.

In one embodiment, the scaling performed in step 630 may be used to set a maximum scaled magnitude for all samples. For example, where the maximum raw magnitude is 1000 and the scaling value is one-tenth or 0.1, the maximum scaled magnitude for all samples in this example may be set to 100 in step 630 by scaling the magnitudes of the samples (e.g., including the first data sample) by the scaling value of one-tenth or 0.1.

As shown in FIG. 6A, step 635 involves determining, based on the magnitude (e.g., determined in step 625) and/or the scaled magnitude (e.g., generated in step 630), a counter (or bin) of a plurality of counters (or plurality of bins) associated with the first data sample. In one embodiment, step 635 may involve determining the counter (e.g., counter 552 of counter component 550 of FIG. 5, counter 554 of counter component 550 of FIG. 5, counter 556 of counter component 550 of FIG. 5, some combination thereof, etc.) associated with the first data sample by indexing counter information memory 535 (e.g., using the magnitude determined in step 625 and/or the scaled magnitude generated in step 630) to retrieve or access information associated with the counter (e.g., a counter number, a value associated with the counter, a counter identifier, etc.). In one embodiment, counter information memory 535 may include an index of counter information (e.g., counter numbers, values associated with the counters, counter identifiers, etc.) and magnitudes (e.g., particular magnitudes, ranges of magnitudes, etc.), where each of the magnitudes or ranges of magnitudes may be associated with a respective portion of counter information (e.g., a counter number, a value associated with the counter, a counter identifier, etc.).

FIG. 7 shows exemplary data structure 700 including an index of counter information and magnitudes in accordance with one embodiment of the present invention. In one embodiment, data structure 700 may be stored in computer information memory 535 of FIG. 5.

As shown in FIG. 7, column 710 may include a plurality of portions of counter information. The counter information may include counter numbers, values associated with the counters, counter identifiers, some combination thereof, etc. In one embodiment, each of the counters of counter component 550 (e.g., counter 552, counter 554, counter 556, etc.) may be associated with a respective portion or row of counter information in column 710.

Column 720 may include magnitudes associated with the counter information in column 710. Each of the magnitude or ranges of magnitudes in column 720 may be associated with a respective portion of counter information in column 710. For example, the magnitude range (or some value therein) of "1-10" (e.g., 1 through 10) as shown in first row of data structure 700 may be associated with a first counter (e.g., associated with the counter information of "1"), the magnitude range (or some value therein) of "11-20" (e.g., 11 through 20) as shown in second row of data structure 700 may be associated with a second counter (e.g., associated with the counter information of "2"), etc. In this manner, data structure 700 (or a memory storing data structure 700) may be indexed (e.g., using a magnitude or range of magnitudes to determine a counter associated therewith.

Turning to FIG. 6B, step 640 involves incrementing the counter (e.g., determined in step 635). The counter may be incremented in step 640 by counter access component 540 based on counter information (e.g., a counter number, a value associated with the counter, a counter identifier, the counter information accessed or determined in step 635, etc.) accessed from counter determination component 530.

In one embodiment, counter component 550 may be implemented using a memory, where each counter within counter component 550 may be associated with a respective space or portion within the memory. As such, a counter may be updated or incremented by writing to the space or portion of memory associated with the counter.

As shown in FIG. 6B, step 645 involves scaling a value associated with the counter to determine a limit. The value may be increased or decreased based on the second scaling value in step 645. In one embodiment, the value may be accessed from counter determination component 530 (e.g., as at least part of the counter information determined or accessed in step 635) and scaled in step 645 by limit determination component 560 (e.g., of FIG. 5) based on a second scaling value accessed from scaling value memory 565 (e.g., of FIG. 5). The scaling performed in step 645 may involve performing a multiplication operation using the value and the second scaling value and/or a division operation using the value and the second scaling value (e.g., by inverting the value and multiplying the result by the second scaling value, by inverting the second scaling value and multiplying the result by the value, etc.). The second scaling value may be stored in scaling value memory 565 in step 610 in one embodiment.

In one embodiment, the scaling performed in step 645 may be used to determine a bin or counter limit for a given magnitude or range of magnitudes (e.g., associated with the counter determined in step 635, associated with the scaled magnitude generated in step 630, associated with the magnitude determined in step 625, etc.). For example, where the value is "1" (e.g., associated with the magnitude range of "1-10" as shown in FIG. 7) and the second scaling value is 10, the limit determined in step 645 may be "10" (e.g., the value of one multiplied by the second scaling value of ten). As another example, where the value is "2" (e.g., associated with the magnitude range of "11-20" as shown in FIG. 7) and the second scaling value is 10, the limit determined in step 645 may be "20" (e.g., the value of two multiplied by the second scaling value of 20). In this manner, a limit may be advantageously determined for a counter or bin based on a value associated with the counter and a second scaling value (e.g., stored in scaling value memory 565).

In one embodiment, the limit associated with each counter or bin may be different. For example, where the respective value for each counter is different, then the respective limit for each counter may be different. As such, in one embodiment, a counter-specific or unique limit may be determined for each counter or bin.

As shown in FIG. 6B, step 650 involves determining if the limit (e.g., determined in step 645) has been reached. Step 650 may involve comparing the limit (e.g., determined in step 645) to a current level of a counter or bin. For example, as shown in FIG. 5, counter monitoring component 570 may compare current level 545 (e.g., accessed from counter access component 540) to limit 565 (e.g., accessed from limit determination component 560). Current level 545 may be a current value or level of a counter associated with the first data sample, whereas limit 565 may be a limit associated with the counter. If current level 545 is below or less than limit 565, then it may be determined (e.g., by counter monitoring component 570) in step 650 that limit 565 has not been reached and process 600 may proceed to step 655.

Step 655 involves generating a signal for selecting the first data sample and/or a second data sample associated therewith. For example, as shown in FIG. 5, counter monitoring component 570 may generate selection signal 575 for causing selection component 580 to select the first data sample (e.g., accessed via signal 412) and/or the second data sample (e.g., accessed via signal 414). The at least one selected sample (e.g., the first data sample and/or the second data sample) may be output from selection component 580 responsive thereto (e.g., the first data sample output as or via signal 422, the second data sample output as or via signal 424, etc.) in one embodiment.

The second data sample may be associated with at least one data sample 175 (e.g., associated with a sample of amplified signal 145 output from amplifier 140). Additionally, the first data sample may correspond to the second data sample (e.g., be samples of the same data or signal before input to and after output from amplifier 140, be taken contemporaneously at the input and output of amplifier 140, some combination thereof, etc.).

As shown in FIG. 6C, step 665 may involve generating at least one coefficient based on the first data sample and/or the second data sample. For example, as shown in FIG. 4, estimation component 430 may access the first data sample (e.g., supplied via signal 422) and/or the second data sample (e.g., supplied via signal 424) and perform estimation based thereon to generate coefficients (e.g., 185) in step 665.

In one embodiment, step 665 may be performed based on a plurality of data samples that has been selected (e.g., in step 650 and/or step 655). The plurality of data samples may form a batch or collection of data samples in one embodiment. As such, in one embodiment, one or more of the previous steps of process 600 may be repeated for at least one other data sample (e.g., as discussed with respect to step 695 of FIG. 6C) to either select (e.g., in accordance with step 650 and/or step 655) or not select (e.g., in accordance with step 650 and/or step 660) the at least one data sample before generating at least one coefficient based on the plurality of selected data samples in step 665.

Step 670 involves performing digital predistortion of data based on the at least one coefficient. For example, as shown in FIG. 1, predistortion component 110 may perform digital predistortion of input data 105 based on the at least one coefficient (e.g., 185) in step 670.

As shown in FIG. 6C, step 675 involves converting the distorted data to an analog signal. For example, DAC 120 (e.g., of FIG. 1) may convert the distorted data (e.g., predistorted input data 115) to an analog signal in step 675.

Step 680 involves processing the analog signal. In one embodiment, step 680 may involve upconverting the analog signal, where the upconversion of the analog signal (e.g., output by DAC 120) may be performed by upconverter 130 (e.g., of FIG. 1) to generate predistorted analog signal 135. And in other embodiments, step 680 may involve additional or different signal processing operations.

As shown in FIG. 6C, step 685 involves amplifying the analog signal. For example, as shown in FIG. 1, amplifier 140 may amplify predistorted analog signal 135 in step 685 to generate amplified signal 145.

Step 690 may involve transmitting the analog signal. In one embodiment, step 690 may involve transmitting amplified signal 145 (or a signal associated therewith) as a radio frequency (RF) signal. And in one embodiment, step 690 may involve transmitting amplified signal 145 (or a signal associated therewith) to another system or device (e.g., from at least one RRH including or otherwise associated with amplifier 140) to implement a wireless network (e.g., a WiMAX wireless network, another type of wireless network, etc.).

Turning back to FIG. 6B, if current level 545 meets or exceeds limit 565, then it may be determined (e.g., by counter monitoring component 570) in step 650 that limit 565 has been reached and process 600 may proceed to step 660. Step 660 involves generating a signal for not selecting or ignoring the first data sample and/or the second data sample. For example, as shown in FIG. 5, counter monitoring component 570 may generate selection signal 575 for causing selection component 580 to not select or ignore the first data sample (e.g., accessed via signal 412) and/or the second data sample (e.g., accessed via signal 414). In this case, the first data sample and/or the second data sample may be not be output from selection component 580. In this manner, sample selection signal 575 may be used to either select at least one data sample (e.g., in accordance with step 655) or to not select (or ignore) at least one data sample (e.g., in accordance with step 660).

As shown in FIG. 6C, step 695 involves repeating one or more of the previous steps for at least one other data sample. In one embodiment, the at least one other data sample may be part of or included in input data 105 (e.g., as shown in FIG. 1) and/or at least one data sample 175 (e.g., as shown in FIG. 1).

Figure 8:
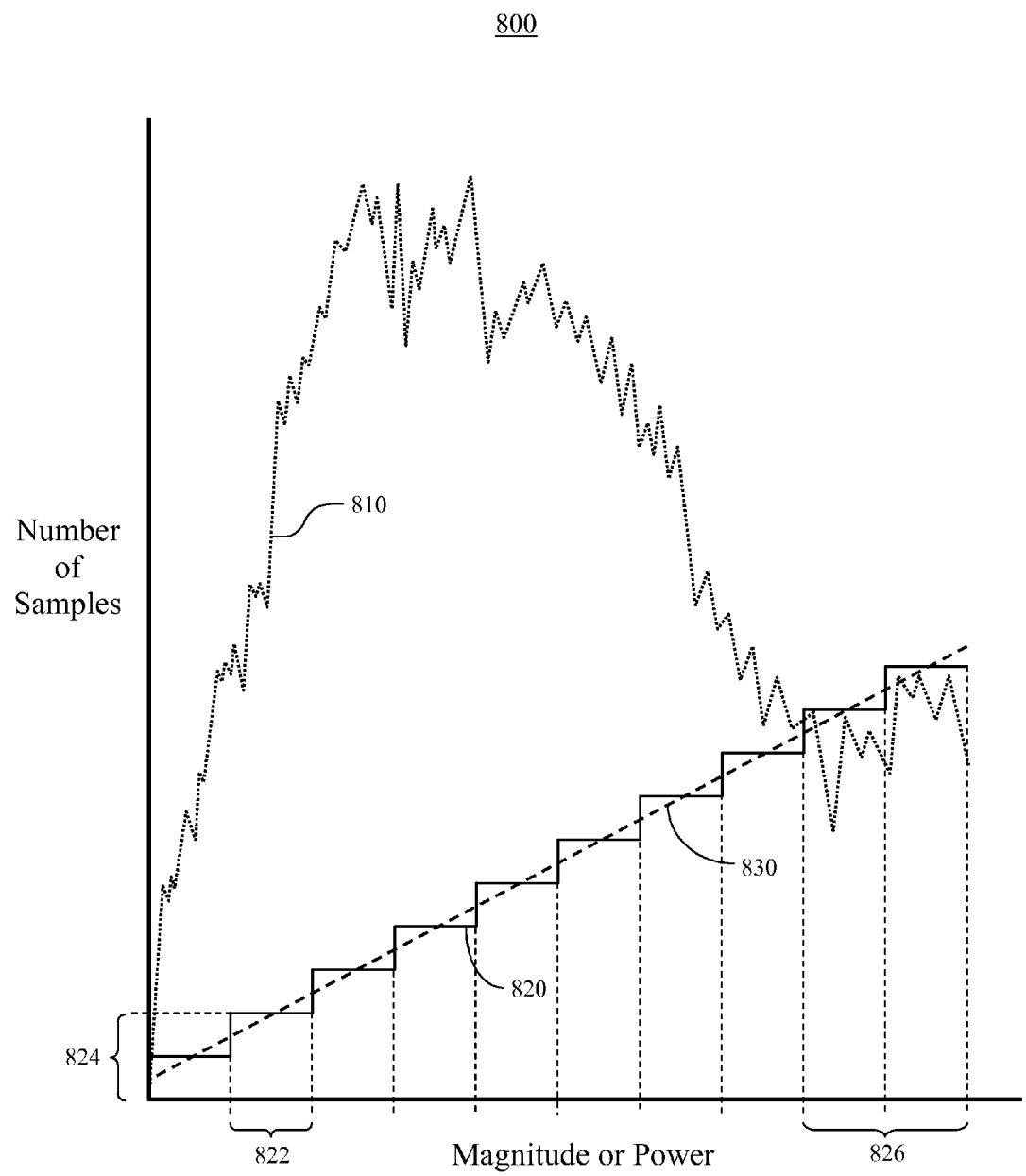
FIG. 8 shows a diagram of exemplary sample selection in accordance with one embodiment of the present invention.

FIG. 8 shows diagram 800 of exemplary sample selection in accordance with one embodiment of the present invention. As shown in FIG. 8, plot 810 depicts a respective number of raw samples (e.g., along the "y" axis) for each magnitude or power (e.g., along the "x" axis). The raw samples may be associated with or of input data 105 before selection (e.g. performed in accordance with process 600 or at least one step thereof) in one embodiment.

Plot 820 represents a maximum number of samples that can be selected across a plurality of magnitudes or powers. In one embodiment, each horizontal portion of plot 820 may be associated with or caused by a respective limit (e.g., determined in step 645 of process 600) associated with a respective range of magnitudes (or a respective counter of counter component 550 of FIG. 5). For example, a limit associated with magnitude range 822 (or a counter or bin associated therewith) may limit the number of samples selected for magnitude range 822 to number of samples 824.

As such, where plot 810 is above plot 820 (e.g., for magnitudes below magnitude range 826), plot 820 may represent the number of samples selected from the number of raw samples associated with plot 810. However, since the number of samples selected may not exceed the number of samples received or accessed (e.g., as part of input data 105) in one embodiment, the number of samples selected in magnitude range 826 may be represented by the portion of plot 810 with magnitude range 826 (e.g., which lies below plot 820). In this manner, all samples may be selected from the raw samples for any magnitude or magnitude range where plot 810 is below plot 820 in one embodiment.

Accordingly, as shown in FIG. 8, the number of samples selected for lower magnitudes (e.g., below magnitude range 826) may be less than the number of raw samples (e.g., accessed or received). Samples of lower magnitudes or powers may be less relevant or important for performing digital predistortion since the distortion of power amplifiers is usually higher at higher magnitudes or powers (e.g., as shown in FIG. 3B). In this manner, fewer of the samples of lower magnitudes or powers may be selected, thereby saving resources and time that would otherwise be spent processing the samples that are advantageously ignored or not selected by embodiments of the present invention. Thus, digital predistortion can be performed more quickly and efficiently with fewer resources (e.g., compared to conventional solutions that use blocks of consecutive samples without considering the magnitude of the samples).

Additionally, as shown in FIG. 8, all or a large percentage of the samples of higher magnitudes or powers (e.g., associated with magnitude range 826) may be selected in one embodiment. Samples of higher magnitudes or powers may be more relevant or important for performing digital predistortion since the distortion of power amplifiers is usually higher at higher magnitudes or powers (e.g., as shown in FIG. 3B). In this manner, embodiments of the present invention may advantageously allow samples of higher magnitudes to be selected while ignoring or not selecting samples of lower magnitudes.

In one embodiment, sample selection may be configured (e.g., in step 605 and/or step 610 of process 600) based on a respective configuration of one or more components of sample selection component 420 (e.g., as depicted in FIG. 5). For example, the scaling value (e.g., stored in scaling value memory 525) accessed by scaling component 520 may be used to configure the allocation of samples to the magnitude ranges or bins (e.g., the respective number of samples associated with each magnitude range or bin) and/or the magnitude range associated with each counter or limit. As another example, the scaling value (e.g., stored in scaling value memory 565) accessed by limit determination component 560 may be used to configure the respective number of samples associated with each limit and/or the slope of the linear approximation of plot 820 (e.g., depicted in FIG. 8 by dashed line 830). As yet another example, counter information (e.g., stored in counter information memory 535) accessed by counter determination component 530 may be used to individually configure the respective number of samples associated with each limit.

Although FIG. 5 shows sample selection component 420 as including a specific number of components, it should be appreciated that sample selection component 420 may include a different number of components in other embodiments. Additionally, although FIG. 5 shows sample selection component 420 as including a specific arrangement of components, it should be appreciated that sample selection component 420 may include a different arrangement of components in other embodiments.

Although FIG. 7 depicts data structure 700 with a certain amount and type of data, it should be appreciated that data structure 700 may include a different amount and/or type of data in other embodiments. Additionally, although FIG. 7 depicts data structure 700 with a certain arrangement of data, it should be appreciated that data structure 700 may include a different arrangement of data in other embodiments.

Although FIG. 8 shows plots (e.g., 810 and 820) with specific shapes and/or positions, it should be appreciated that one or more of the plots (e.g., 810, 820, etc.) may have different shapes and/or positions in other embodiments. Additionally, it should be appreciated that plot 820 may depict or otherwise be associated with a different number of limits, counters, bins, etc. in other embodiments. Further, it should be appreciated that, in other embodiments, one or more magnitude ranges (e.g., 826, 822, the magnitude range below magnitude range 826, etc.) may be different sizes, include a different number of magnitudes, etc. than that depicted in FIG. 8.

Programmable Logic Device

Figure 9:
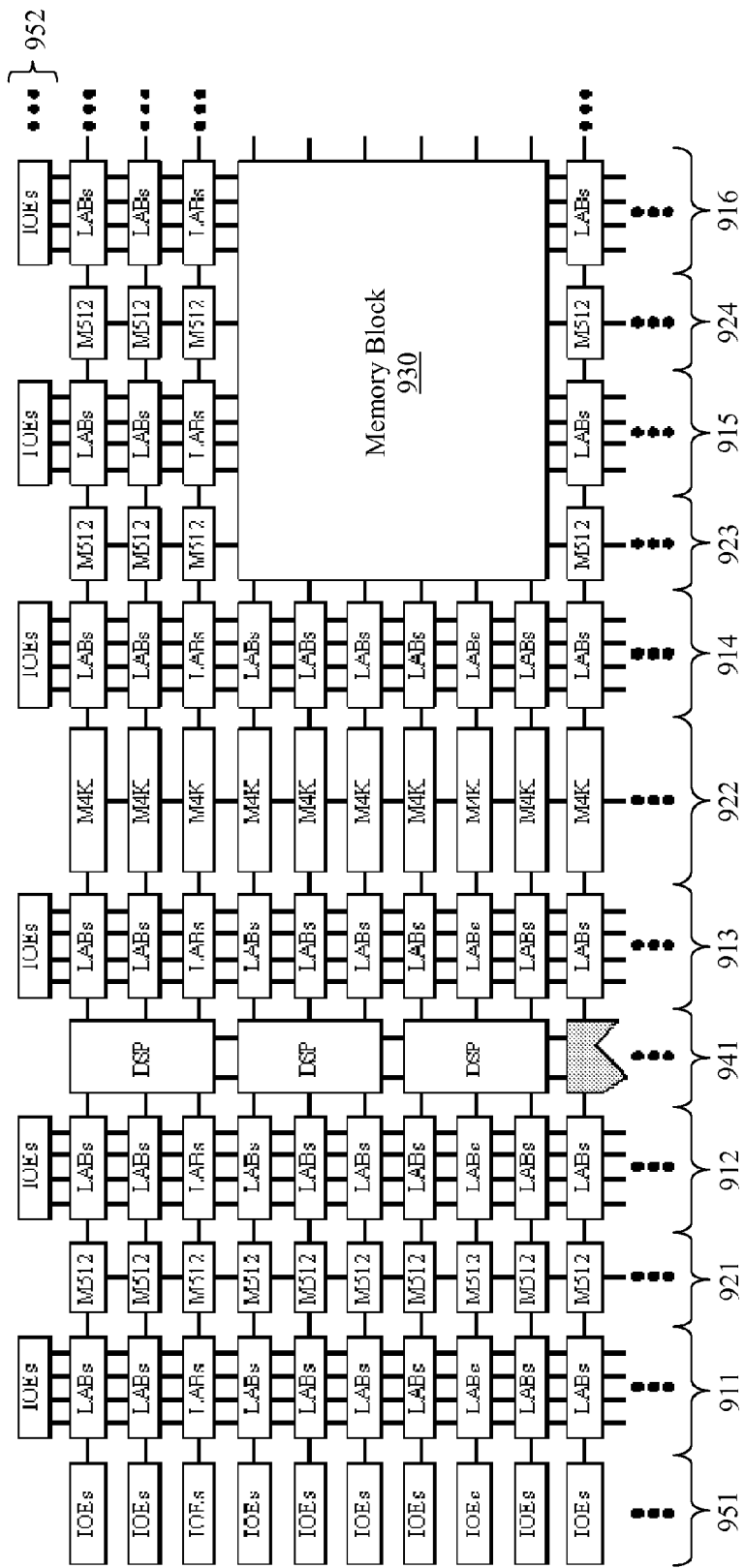
FIG. 9 shows an exemplary programmable logic device that can be used to implement one or more components of one or more embodiments of the present invention.

FIG. 9 shows exemplary programmable logic device (PLD) 900 that can be used to implement one or more components of one or more embodiments of the present invention. For instance, PLD 900 may be used to implement a system (e.g., 100) or at least one component thereof, an adaption component (e.g., 180) or at least one component thereof, at least one sample selection component (e.g., 420), some combination thereof, etc. In one embodiment, PLD 900 of FIG. 9 may be used to implement a field programmable gate array (FPGA), a complex programmable logic device (CPLD), a programmable logic arrays (PLA), or some other type of programmable logic device.

As shown in FIG. 9, PLD 900 may include a plurality of programmable logic array blocks (LABs). The LABs of PLD 900 may be arranged in rows and/or columns (e.g., as two-dimensional arrays) in one embodiment. For example, columns 911, 912, 913, 914, 915 and 916 may include one or more LABs. In one embodiment, the LABs may be interconnected by a network of column interconnect conductors and/or row interconnect conductors.

Each LAB may include logic that can be configured to implement one or more user-defined logic functions. For example, the interconnect structure of a LAB may be programmed to interconnect the components of the LAB in one or more desired configurations. A LAB may include at least one look-up table (LUT), at least one register, at least one multiplexer, some combination thereof, etc. In one embodiment, the logic may be organized into a plurality of logic elements (LEs), where the interconnection of the LEs can be programmed to vary the functionality of the LAB. And in one embodiment, each LAB may implement or form at least one logic element cluster, where each logic element cluster includes one or more respective LEs.

As shown in FIG. 9, PLD 900 may include a plurality of memory blocks (e.g., memory block 930, memory blocks in columns 921, 922, 923, 924, etc.). In one embodiment, a memory block may include random access memory (RAM), where the RAM may be used to provide multi-port memory, dedicated true dual-port memory, simple dual-port memory, single-port memory, or some combination thereof. And in one embodiment, a memory block may include at least one shift register, at least one first-in-first-out (FIFO) buffer, at least one flip-flop, some combination thereof, etc.

The memory blocks of PLD 900 may be arranged in rows and/or columns (e.g., as two-dimensional arrays) in one embodiment. For example, columns 921, 922, 923 and 924 may include one or more memory blocks. Alternatively, one or more memory blocks (e.g., 930) may be located individually or in small groups (e.g., of two memory blocks, three memory blocks, etc.) in the PLD.

As shown in FIG. 9, PLD 900 may include a plurality of digital signal processing (DSP) blocks. The DSP blocks may provide digital signal processing functions such as FIR filtering, infinite impulse response (IIR) filtering, image processing, modulation (e.g., equalization, etc.), encryption, error correction, etc. The DSP blocks may offer other functionality such as accumulation, addition/subtraction, summation, etc.

PLD 900 may include a plurality of input/output elements (IOEs). Each IOE may include at least one input buffer and/or at least one output buffer coupled to one or more pins of the PLD, where the pins may be external terminals separate from the die of the PLD. In one embodiment, an IOE may be used to communicate input signals, output signals, supply voltages, etc. between other components of the PLD and one or more external devices (e.g., separate form the PLD). In one embodiment, the IOEs may be located at end of the rows and columns of the LABs around the periphery of PLD 900 (e.g., in column 951, in row 952, etc.).

In one embodiment, PLD 900 may include routing resources. For example, PLD 900 may include LAB local interconnect lines, row interconnect lines (e.g., "H-type wires"), column interconnect lines (e.g., "V-type wires"), etc. that may be used to route signals between components of PLD 900. The routing resources may be configurable or programmable (e.g., by a user, based on a user design or function, etc.) in one embodiment.

And in one embodiment, PLD 900 may include or otherwise implement at least one processor and at least one memory. The at least one memory may be a computer-readable medium or computer-usable medium in one embodiment, where the at least one memory may include instructions that when executed by the at least one processor may implement a method of selecting at least one data sample (e.g., in accordance with process 600 of FIGS. 6A, 6B, 6C, etc.).

Although one or more embodiments of the present invention may be implemented using a PLD (e.g., 900 of FIG. 9), it should be appreciated that one or more other embodiments of the present invention may be implemented using other systems, components, circuitry, etc. For example, one or more embodiments of the present invention may be implemented using an application specific integrated circuit (ASIC), a memory integrated circuit, a central processing unit, a microprocessor, an analog integrated circuit, another type of integrated circuit, other circuitry, some combination thereof, etc.

Computer System Platform

Figure 10:
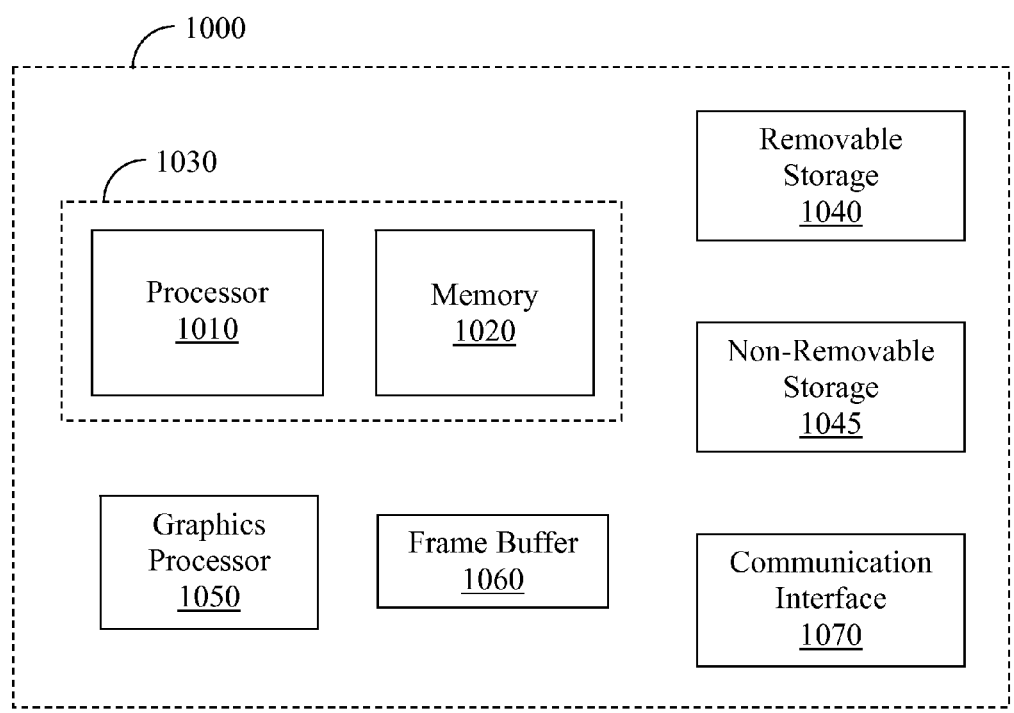
FIG. 10 shows an exemplary computer system platform upon which embodiments of the present invention may be implemented.

FIG. 10 shows exemplary computer system platform 1000 upon which embodiments of the present invention may be implemented. As shown in FIG. 10, portions of the present invention may be implemented by execution of computer-readable instructions or computer-executable instructions that may reside in components of computer system platform 1000 and which may be used as a part of a general purpose computer network. It is appreciated that computer system platform 1000 of FIG. 10 is merely exemplary. As such, the present invention can operate within a number of different systems including, but not limited to, general-purpose computer systems, embedded computer systems, laptop computer systems, hand-held computer systems, portable computer systems, or stand-alone computer systems.

In one embodiment, computer system platform 1000 may be used to implement one or more systems (e.g., 100), one or more components (e.g., of system 100, of adaptation component 180, of sample selection component 420, etc.), some combination thereof, etc. Computer system platform 1000 may include at least one PLD (e.g., 900 of FIG. 9) in one embodiment. In one embodiment, at least a portion of computer system platform 1000 may be implemented using at least one PLD (e.g., 900 of FIG. 9). And in one embodiment, one or more components of computer system platform 1000 may be disposed in and/or coupled with a housing or enclosure.

In one embodiment, depicted by dashed lines 1030, computer system platform 1000 may include at least one processor 1010 and at least one memory 1020. Processor 1010 may include a central processing unit (CPU) or other type of processor. Depending on the configuration and/or type of computer system environment, memory 1020 may include volatile memory (e.g., RAM), non-volatile memory (e.g., ROM, flash memory, etc.), or some combination of the two. Additionally, memory 1020 may be removable, non-removable, etc.

In other embodiments, computer system platform 1000 may include additional storage (e.g., removable storage 1040, non-removable storage 1045, etc.). Removable storage 1040 and/or non-removable storage 1045 may include volatile memory, non-volatile memory, or any combination thereof. Additionally, removable storage 1040 and/or non-removable storage 1045 may include CD-ROM, digital versatile disks (DVD) or other optical storage, magnetic cassettes, magnetic tape, magnetic disk storage or other magnetic storage devices, or any other medium which can be used to store information for access by computer system platform 1000.

As shown in FIG. 10, computer system platform 1000 may communicate with other systems, components, or devices via communication interface 1070. Communication interface 1070 may embody computer-readable instructions, data structures, program modules or other data in a modulated data signal (e.g., a carrier wave) or other transport mechanism. By way of example, and not limitation, communication interface 1070 may couple to wired media (e.g., a wired network, direct-wired connection, etc.) and/or wireless media (e.g., a wireless network, a wireless connection utilizing acoustic, radio frequency (RF), infrared, or other wireless signaling, etc.).

Communication interface 1070 may also couple computer system platform 1000 to one or more input devices (e.g., a keyboard, mouse, pen, voice input device, touch input device or touch screen, etc.). In one embodiment, communication interface 1070 may couple computer system platform 1000 to one or more output devices (e.g., a display, speaker, printer, etc.).

As shown in FIG. 10, graphics processor 1050 may perform graphics processing operations on graphical data stored in frame buffer 1060 or another memory (e.g., 1020, 1040, 1045, etc.) of computer system platform 1000. Graphical data stored in frame buffer 1060 may be accessed, processed, and/or modified by components (e.g., graphics processor 1050, processor 1010, etc.) of computer system platform 1000 and/or components of other systems or devices. Additionally, the graphical data may be accessed (e.g., by graphics processor 1050) and displayed on an output device coupled to computer system platform 1000. Accordingly, memory 1020, removable storage 1040, non-removable storage 1045, frame buffer 1060, or a combination thereof, may be a computer-readable medium (e.g., a computer-readable storage medium) or computer-usable medium and may include instructions that when executed by a processor (e.g., 1010, 1050, etc.) implement a method of selecting at least one data sample (e.g., in accordance with process 600 of FIGS. 6A, 6B, 6C, etc.).

In the foregoing specification, embodiments of the invention have been described with reference to numerous specific details that may vary from implementation to implementation. Thus, the sole and exclusive indicator of what is, and is intended by the applicant to be, the invention is the set of claims that issue from this application, in the specific form in which such claims issue, including any subsequent correction. Hence, no limitation, element, property, feature, advantage, or attribute that is not expressly recited in a claim should limit the scope of such claim in any way. Accordingly, the specification and drawings are to be regarded in an illustrative rather than a restrictive sense.

What is claimed is:

1. A method of selecting at least one data sample, said method comprising:
   accessing a first data sample of a plurality of data samples;
   determining, based on a magnitude associated with said first data sample, a value associated with a counter of a plurality of counters;
   scaling said value associated with said counter to determine a limit associated with said counter;
   determining whether said counter has reached said limit;
   generating at least one signal, if said counter has not reached said limit, for selecting said first data sample for use in performing digital predistortion of data before generation of an analog signal for input to an amplifier; and
   generating at least one other signal, if said counter has reached said limit, for not selecting said first data sample for use in performing said digital predistortion.

2. The method of claim 1 further comprising:
   responsive to said determining said value associated with said counter, incrementing said counter.

3. The method of claim 1, wherein said first data sample is associated with a signal input to said amplifier, wherein said first data sample corresponds to a second data sample of said plurality of data samples, wherein said second data sample is a sample associated with a signal output from said amplifier, and wherein said generating further comprises generating said at least one signal for selecting said first and second data samples for use in performing said digital predistortion.

4. The method of claim 1 further comprising:
   determining said magnitude associated with said first data sample; and
   scaling said magnitude based on a first scaling value to generate a scaled magnitude, and
   wherein said determining said value associated with said counter further comprises determining said value associated with said counter based on said scaled magnitude.

5. The method of claim 1, wherein said scaling further comprises scaling said value based on a second scaling value to determine said limit, and wherein said limit is different than at least one other limit associated with at least one other counter of said plurality of counters.

6. The method of claim 1 further comprising:
   generating at least one coefficient based on said first and second data samples; and
   performing said digital predistortion based on said at least one coefficient.

7. A circuit comprising:
   a first component operable to access a first data sample of a plurality of data samples, wherein said first component is further operable to determine, based on a magnitude associated with said first data sample, a value associated with a counter of a plurality of counters;
   a second component operable to scale said value associated with said counter to determine a limit associated with said counter; and
   a third component operable to determine whether said counter has reached said limit, and wherein said third component is further operable to generate at least one signal, if said counter has not reached said limit, for selecting said first data sample for use in performing digital predistortion of data before generation of an analog signal for input to an amplifier, wherein said third component is further operable to generate at least one other signal, if said counter has reached said limit, for not selecting said first data sample for use in performing said digital predistortion.

8. The circuit of claim 7 further comprising:
   a fourth component operable to increment said counter responsive to said first component determining said value associated with said counter.

9. The circuit of claim 7, wherein said first data sample is a sample of data input to said amplifier, wherein said first data sample corresponds to a second data sample of said plurality of data samples, wherein said second data sample is a sample of data output from said amplifier, and wherein said third component is further operable to generate said at least one signal for selecting said first and second data samples for use in performing said digital predistortion.

10. The circuit of claim 7 further comprising:
    a fifth component operable to determine said magnitude associated with said first data sample; and
    a sixth component operable to scale said magnitude based on a first scaling value to generate a scaled magnitude, and
    wherein said first component is further operable to determine said value associated with said counter based on said scaled magnitude.

11. The circuit of claim 7, wherein said second component is further operable to scale said value based on a second scaling value to determine said limit, and wherein said limit is different than at least one other limit associated with at least one other counter of said plurality of counters.

12. The circuit of claim 7 further comprising:
   a seventh component operable to generate at least one coefficient based on said first and second data samples; and
   an eight component operable to perform said digital predistortion based on said at least one coefficient.

13. A system comprising:
   a processor;
   a memory operable to implement a plurality of counters; and
   a circuit comprising:
      a first component operable to access a first data sample of a plurality of data samples, wherein said first component is further operable to determine, based on a magnitude associated with said first data sample, a value associated with a counter of a plurality of counters;
      a second component operable to scale said value associated with said counter to determine a limit associated with said counter; and
      a third component operable to determine whether said counter has reached said limit, and wherein said third component is further operable to generate at least one signal, if said counter has not reached said limit, for selecting said first data sample for use in performing digital predistortion of data before generation of an analog signal for input to an amplifier, wherein said third component is further operable to generate at least one other signal, if said counter has reached said limit, for not selecting said first data sample for use in performing said digital predistortion.

14. The system of claim 13, wherein said circuit further comprises a fourth component operable to increment said counter responsive to said first component determining said value associated with said counter.

15. The system of claim 13, wherein said first data sample is a sample of data input to said amplifier, wherein said first data sample corresponds to a second data sample of said plurality of data samples, wherein said second data sample is a sample of data output from said amplifier, and wherein said third component is further operable to generate said at least one signal for selecting said first and second data samples for use in performing said digital predistortion.

16. The system of claim 13, wherein said circuit further comprises:
   a fifth component operable to determine said magnitude associated with said first data sample; and
   a sixth component operable to scale said magnitude based on a first scaling value to generate a scaled magnitude, and
   wherein said first component is further operable to determine said value associated with said counter based on said scaled magnitude.

17. The system of claim 13, wherein said second component is further operable to scale said value based on a second scaling value to determine said limit, and wherein said limit is different than at least one other limit associated with at least one other counter of said plurality of counters.

18. The system of claim 13, wherein said circuit further comprises:
   a seventh component operable to generate at least one coefficient based on said first and second data samples; and
   an eight component operable to perform said digital predistortion based on said at least one coefficient.

19. The system of claim 13 further comprising:
   said amplifier.

* * * * *